United States Patent
Oh et al.

(10) Patent No.: US 10,613,795 B2
(45) Date of Patent: Apr. 7, 2020

(54) PRE-PROCESSING SYSTEM, METHOD PROCESSING CHARACTERISTIC DATA, AND MEMORY CONTROL SYSTEM USING SAME

(71) Applicant: SAMSUNG ELECTRONICS CO., LTD., Suwon-si, Gyeonggi-do (KR)

(72) Inventors: Hyun Ko Oh, Yongin-si (KR); Seung Kyung Ro, Anyang-si (KR); Hye Ry No, Seoul (KR); Jin Baek Song, Hwaseong-si (KR); Dong Gi Lee, Yongin-si (KR); Hee Won Lee, Seoul (KR); Dong Hoo Lim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 4 days.

(21) Appl. No.: 15/954,127

(22) Filed: Apr. 16, 2018

(65) Prior Publication Data
US 2019/0087119 A1    Mar. 21, 2019

(30) Foreign Application Priority Data
Sep. 19, 2017    (KR) .................. 10-2017-0120657

(51) Int. Cl.
| G06F 3/06 | (2006.01) |
| G11C 11/56 | (2006.01) |
| G11C 16/26 | (2006.01) |
| G11C 29/02 | (2006.01) |
| G11C 16/04 | (2006.01) |

(52) U.S. Cl.
CPC .......... *G06F 3/0653* (2013.01); *G06F 3/0619* (2013.01); *G06F 3/0679* (2013.01); *G11C 11/5642* (2013.01); *G11C 16/26* (2013.01); *G11C 29/028* (2013.01); *G11C 16/0483* (2013.01)

(58) Field of Classification Search
CPC . G11C 16/26; G11C 11/5642; G11C 16/0483; G11C 29/028; G06F 3/0619; G06F 3/0653; G06F 3/0679
USPC ......................................... 711/103
See application file for complete search history.

(56) References Cited

U.S. PATENT DOCUMENTS

| 8,645,793 | B2 | 2/2014 | Wu et al. |
| 9,111,626 | B2 | 8/2015 | Kim et al. |
| 9,129,698 | B2 | 9/2015 | Zeng et al. |
| 9,164,881 | B2 | 10/2015 | Seol et al. |

(Continued)

FOREIGN PATENT DOCUMENTS

JP    JP2017049674 A    3/2017

*Primary Examiner* — Hashem Farrokh
(74) *Attorney, Agent, or Firm* — Volentine, Whitt & Francos, PLLC

(57) ABSTRACT

A characteristic data pre-processing system includes a data acquisition device that collects characteristic data including first cell distribution data defined according to first default read levels, and second cell distribution data defined according to second default read levels, a data pre-processing apparatus that merges the first cell distribution data and the second cell distribution data according crop ranges to generate training data, wherein the crop ranges are defined according to the first default levels and the second default levels, and a database that stores the training data communicated from the data pre-processing apparatus.

20 Claims, 12 Drawing Sheets

(56) References Cited

U.S. PATENT DOCUMENTS

| | | |
|---|---|---|
| 9,257,204 B2 | 2/2016 | Lin et al. |
| 2009/0319868 A1* | 12/2009 | Sharon ................ G06F 11/1068 714/763 |
| 2011/0007563 A1* | 1/2011 | Yoo ..................... G11C 11/5642 365/185.03 |
| 2017/0125110 A1* | 5/2017 | Sankaranarayanan ....................... G11C 16/26 |

* cited by examiner

| Data1(mV) | | Data2(mV) | |
|---|---|---|---|
| R1 | -1715 | R1 | -1730 |
| R2 | -945 | R2 | -970 |
| R3 | -250 | R3 | -255 |
| R4 | 510 | R4 | 510 |
| R5 | 1260 | R5 | 1275 |
| R6 | 2075 | R6 | 2090 |
| R7 | 2985 | R7 | 3020 |

| Crop range (Around Default Read Level) | |
|---|---|
| R1 | [0~1000mV] Around R1 |
| R2 | [0~1000mV] Around R2 |
| R3 | [0~1000mV] Around R3 |
| R4 | [-1000mV~1000mV] Around R6 |
| R5 | [0~2000mV] Around R5 |
| R6 | [-1000mV~1000mV] Around R6 |
| R7 | [-1000mV~1000mV] Around R7 |

K:(CD of 40 and 60)

Remove Meaningless Data

|  | R1 | R2 | R3 | R4 | R5 | R6 | R7 |
|---|---|---|---|---|---|---|---|
| A1(Intercept) | 4 | 135 | -4 | 1 | 4 | 3 | 1 |
| $B(x^1)$ | -4 | 0 | 2 | -3 | -1 | -9 | -2 |
| $C(x^2)$ | 1 | 0 | -5 | 2 | 1 | 8 | 1 |
| $D(x^3)$ | -1 | 0 | -2 | -8 | -4 | -2 | -4 |

PRE-PROCESSING SYSTEM, METHOD PROCESSING CHARACTERISTIC DATA, AND MEMORY CONTROL SYSTEM USING SAME

This application claims priority from Korean Patent Application No. 10-2017-0120657 filed on Sep. 19, 2017 in the Korean Intellectual Property Office, the subject matter of which is hereby incorporated by reference.

BACKGROUND

1. Field of the Invention

The inventive concept relates to a pre-processing system, apparatus and method for processing characteristic data, and a memory control system using same.

2. Description of the Related Art

A flash memory device includes a memory cell array, the memory cell array includes a plurality of blocks, each of the plurality of blocks includes pages, and each of the pages includes non-volatile memory cells.

The flash memory device may be classified into a NAND flash memory device and a NOR flash memory device. The non-volatile memory cell includes a floating gate.

As data remains stored in a flash memory cell without being accessed or refreshed, the electrical charge on the constituent floating gate is gradually lost. At some point in this dissipation of floating gate charge for one or more flash memory cells, distribution characteristics will deteriorate to the point where stored data states become errant or incoherent.

That is, when the deteriorated threshold voltage(s) fall below read voltage(s), the bit value of data read from the flash memory cell will be errantly interpreted during a read operation. Thus, the read information retrieved from the flash memory cell will include one or more bit errors.

Therefore, it is important to adjust (or correct) real voltage levels for non-volatile memory cells by analyzing and compensating for deteriorated operating conditions. For this purpose, it is necessary to analyze, identify and correct errant characteristic data describing a the non-volatile memory cell.

SUMMARY

In one aspect the inventive concept provides a characteristic data pre-processing system capable of reducing characteristic data errors. In another aspect the inventive concept provide a characteristic data pre-processing apparatus capable of reducing characteristic data errors. In still another aspect the inventive concept provides a characteristic data pre-processing method that reduces characteristic data errors. In still another aspect the inventive concept provides a memory control system exhibiting improve performance by reducing characteristic data errors.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the inventive concept, there is provided a characteristic data pre-processing system including; a data acquisition device that collects characteristic data including first cell distribution data defined according to first default read levels, and second cell distribution data defined according to second default read levels, a data pre-processing apparatus that merges the first cell distribution data and the second cell distribution data according crop ranges to generate training data, wherein the crop ranges are defined according to the first default levels and the second default levels, and a database that stores the training data communicated from the data pre-processing apparatus.

According to another aspect of the inventive concept, there is provided a characteristic data pre-processing apparatus including; a data pre-processing system that receives m first cell distribution data derived from a first NAND flash memory using a first resolution and m second cell distribution data derived from a second NAND flash memory using a second resolution different from the first resolution, where 'm' is an integer equal to a number of read bits for each of the first NAND flash memory and the second NAND flash memory, wherein the data pre-processing apparatus includes, an average unspooling module that equalizes the first and second resolutions, and a data merging module that merges the first and second cell distribution data according to m crop ranges to generate corresponding training data.

According to another aspect of the inventive concept, there is provided a memory control system, including; a data acquisition device collecting a plurality of characteristic data including first and second cell distribution data, a data pre-processing apparatus merging the first and second cell distribution data according to predetermined crop ranges to generate training data, a database including the training data, and a machine learning model learning the training data to derive a control coefficient.

According to another aspect of the inventive concept, there is provided a characteristic data pre-processing method including; collecting a plurality of characteristic data including first and second cell distribution data, in which the first cell distribution data includes n first default read levels and the second cell distribution data include n second default read levels, and merging the first and second cell distribution data according to predetermined n crop ranges to generate training data, in which the crop ranges are defined based on the first and second default levels.

According to another aspect of the inventive concept, there is provided a method of data pre-processing including; receiving m first cell distribution data derived from a first NAND flash memory using a first resolution and m second cell distribution data derived from a second NAND flash memory using a second resolution different from the first resolution, where 'm' is an integer equal to a number of read bits for each of the first NAND flash memory and the second NAND flash memory, equalizing the first and second resolutions, merging the first and second cell distribution data according to m crop ranges to generate corresponding training data, and storing the training data in a database.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION

Hereinafter, certain embodiments of the inventive concept will be described with reference to the attached drawings. Embodiments are drawn from examples including NAND flash memory, but the scope of the inventive concept is not limited thereto. As functional devices and/or system components, NAND flash memories may be provided with a variety of sizes and in a variety of configurations. However, regardless of specific size or configuration, all or selected portion(s) of constituent NAND flash memory cells may be described or characterized by various memory cell characteristic data (hereafter, singularly of collectively, "characteristic data").

Figure 1:
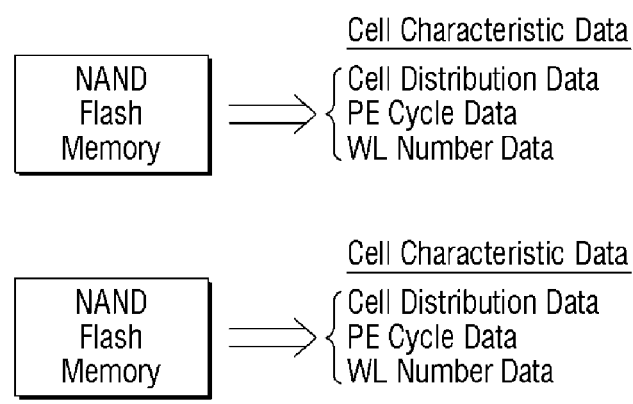
FIG. 1 is a conceptual diagram illustrating one possible approach to the definition of characteristic data that may be used in a characteristic data pre-processing system according to embodiments of the inventive concept.

Figure (FIG. 1 illustrates one approach wherein characteristic data derived from respective NAND flash memories are used in conjunction with a pre-processing system according to embodiments of the inventive concept. In this regard, respective NAND flash memories may exhibit notably different characteristic data even though they are similarly designed and manufactured using the same process(es). Characteristic data may be variously defined or expressed, but may include for example, cell distribution data, program/erase (PE) cycle data, wordline number data, retention data, temperature data, etc. Indeed, each NAND flash memory may be effectively and respectively described in relation to well-considered (i.e., appropriately defined) corresponding characteristic data. Further, the performance of each NAND flash memory may be described across a range of operating and/or environmental conditions according to corresponding characteristic data.

This is a notable possibility as NAND flash memories manufactured by the same processes may nonetheless exhibit different performance capabilities, such as cell distribution data. That is, cell distribution data (e.g., data characterizing the voltage ranges over which NAND flash memory cells may be programmed), as one example, may vary between NAND flash memories similarly manufactured, and may further diverge during use and/or as the result of differing measurement methods.

Figure 2:
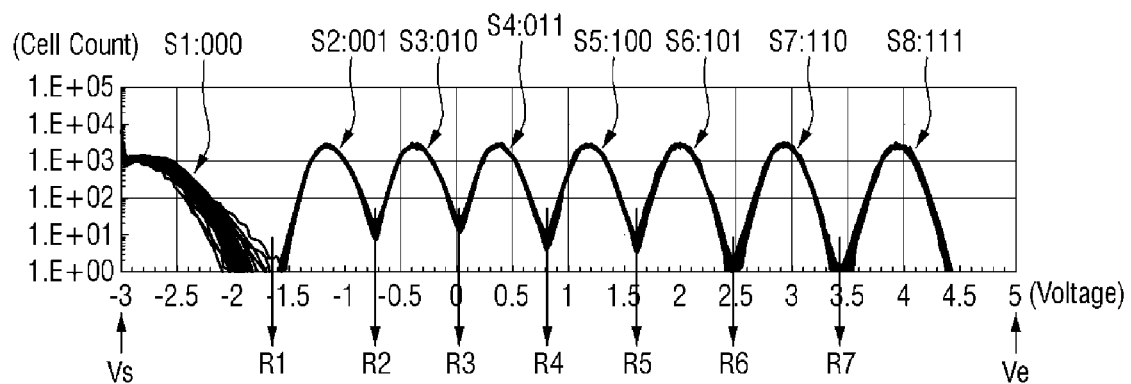
FIG. 2 is a graph illustrating exemplary cell distribution data that may be included in the characteristic data of FIG. 1.

FIG. 2 is a graph illustrating cell distribution data that may be included in characteristic data for (e.g.,) a 3-bit NAND flash memory. Referring to FIG. 2, the horizontal axis of the graph indicates voltage and the vertical axis indicates a cell count. Recognizing that NAND flash memories are commonly available as single level cell (SLC), multi-level cell (MLC), and triple level cell (TLC), the example of FIG. 2 assumes the use of a TLC (or 3-bit NAND memory cell) capable of storing data in one of eight (8) possible data states (i.e., first to eighth states, or S1 to S8). Here, the first state S1 may be ascribed a bit state of 000, the second state S2 a bit state of 001, the third state S3 a bit state of 010, the fourth state S4 a bit state of 011, the fifth state S5 a bit state of 100, the sixth state S6 a bit state of 101, the seventh state S7 a bit state of 110, and the eighth state S8 a bit state of 111.

During a read operation (i.e., in response to the execution of a read operation directed to identified address(es) of the NAND flash memory), each of eight (8) possible data states may be respectively identified using a corresponding first to seventh default read levels R1 to R7. That is, when a read voltage for the NAND flash memory is lower than the first default read level R1, the first state S1 may be identified; when the read voltage is between the first default read level R1 and the second default read level R2, the second state S2 may be identified; when the read voltage is between the second default read level R2 and the third default read level R3, the third state S3 may be identified; when the read voltage is between the third default read level R3 and the fourth default read level R4, the fourth state S4 may be identified; when the read voltage is between the fourth default read level R4 and the fifth default read level R5, the fifth state S5 may be identified; when the read voltage is between the fifth default read level R5 and the sixth default read level R6, the sixth state S6 may be identified; when the read voltage is between the sixth default read level R6 and the seventh default read level R7, the seventh state S7 may be identified, and when the read voltage is higher the seventh default read level R7, the eighth state S8 may be identified. Accordingly, the NAND flash memory may said to use ($2^N$−1) default read levels to discriminate data states, where 'N' is the number of bits used to store data in the NAND flash memory.

As will be appreciated, the cell distribution data may be variously defined. For example, cell distribution data may include a start voltage (Vs), an end voltage (Ve), and a defined resolution. In the context of the example illustrated in FIG. 2, for example, the start voltage Vs—the voltage at which determination (or measurement) of the cell distribution data begins—is assumed to be −3.0 V, and the end voltage Ve—the voltage at which determination of the cell distribution data ends—is assumed to be 5.0 V. Further in this context, the term "resolution" denotes a measurement interval over the voltage range defined between the start voltage Vs and the end voltage Ve. The illustrated example of FIG. 2 assumes a cell distribution data resolution of 40 mV. Thus, for any given read operation, a start voltage Vs, an end voltage Ve, and a resolution may be set at the time of measurement for the cell distribution data (e.g., during NAND flash memory testing). When the resolution is set to be relatively larger, memory or register space used to store the resulting cell distribution data may be efficiently utilized.

Figure 3:
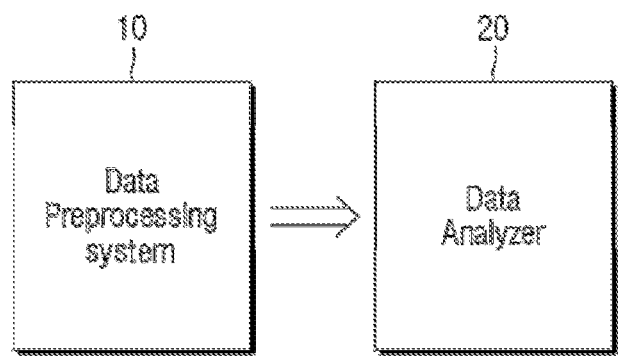
FIG. 3 is a general block diagram illustrating a characteristic data pre-processing system according to embodiments of the inventive concept.

FIG. 3 is a general block diagram illustrating a characteristic data pre-processing system according to embodiments of the inventive concept. Here, the characteristic data pre-processing system includes a first data pre-processing system 10 and a first data analyzer 20.

The first data pre-processing system 10 may be used to pre-process characteristic data derived (or measured) from a NAND flash memory. The resulting characteristic data may be derived using different formats for corresponding NAND flash memories. Accordingly, only when the potentially format-disparate characteristic data is merged into a data set having a common format will the occurrence of errors in subsequent data analysis be minimized. Accordingly, upon receiving the characteristic data, the first data pre-processing system 10 pre-processes the characteristic data to generate training data suitable for additional processing and/or subsequent analysis.

The first data analyzer 20 may be used to receive the resulting training data from the first data pre-processing system 10, and "learns" the training data through the execution of one or more machine learning techniques and provides appropriate "parameters" associated with the training data. In this context, one of the parameters provided by the first data analyzer 20 may be information useful in the definition of (or searching for) optimum read level(s) for the characteristic data of a NAND flash memory.

Figure 4:
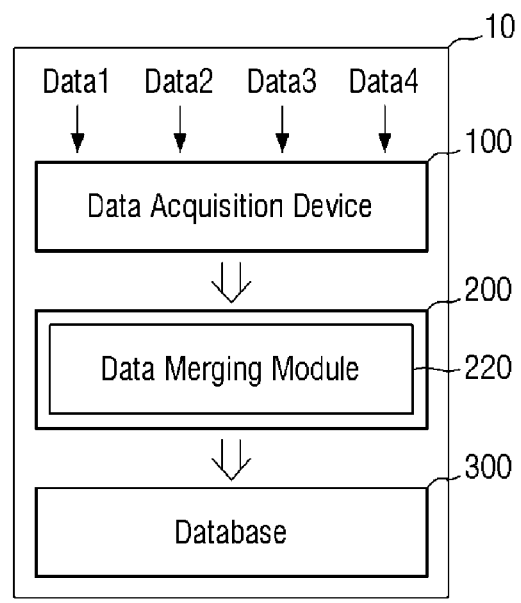
FIG. 4 is a block diagram further illustrating in one example the characteristic data pre-processing system 10 of FIG. 3.

FIG. 4 is a block diagram further illustrating in one example the first data pre-processing system 10 of FIG. 3, including a data acquisition device 100, a data pre-processing apparatus 200, and a database 300.

The data acquisition device 100 may be used to collect a plurality of characteristic data (e.g., first to fourth characteristic data or Data1 to Data4). Here, the first to fourth characteristic data may be characteristic data derived from four (4) different NAND flash memories. Consistent with the foregoing description, each one of the first to fourth characteristic data may include cell distribution data, P/E cycle data, and word line number data, etc.

The data acquisition device 100 may be used to collect the first to fourth characteristic data (Data1 to Data4) and communicate (e.g., transmit) the collected characteristic data to the data pre-processing apparatus 200. As shown in the illustrated example of FIG. 3, the data acquisition device 100 may be separately provided from the data pre-processing apparatus 200, but in some embodiments of the inventive concept, the data acquisition device 100 may be included in the data pre-processing apparatus 200.

Thus, the data pre-processing apparatus 200 receives the first to fourth characteristic data collected by the data acquisition device 100. The data pre-processing apparatus 200 then pre-processes the first to fourth characteristic data in order to generate corresponding training data. The data pre-processing apparatus 200 may then communicate (e.g., transmit and/or store) the training data to the database 300.

In certain embodiments of the inventive concept, the data pre-processing apparatus 200 may include a data merging module 220, where the data merging module 220 is used to "merge" the first to fourth characteristic data in order to generate the training data.

Referring to FIGS. 2 and 4, the cell distribution data included in the characteristic data may have a unique default read level. The default read level, which is a unique value for each NAND flash memory, is a voltage value determined as a read level used to determine one or more data state(s).

Thus, extending the above description, even in a case where NAND flash memories of same design (or model or part number) are manufactured using the same process(es), different read levels may nonetheless be obtained, and these read levels may be set as default read levels.

Figures 5, 6:
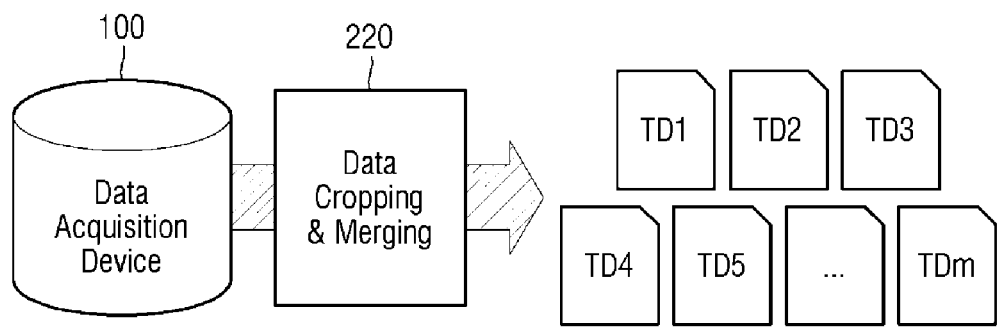
FIG. 5 is a table listing exemplary default read levels for NAND flash memory.
FIG. 6 is a conceptual diagram illustrating one possible approach to the operation of the data merging module 220 of FIG. 4.

For example, FIG. 5 is a table listing different default read levels for first characteristic data (Data1) and second characteristic data (Data2), where such differences levels may be attributed to the small variations in manufacturing. Here, seven default read levels (R1 to R7) are listed for a first TLC NAND flash memory and a second TLC flash memory as part of respective characteristic data. The first to seventh default read levels R1 to R7 may differ in different directions within different cell distribution data. That is, the first default read level R1 in the first characteristic data Data1 is greater than the first default read level R1 in the second characteristic data Data2, but the fourth default read level R4 in the first characteristic data Data1 is equal to the fourth default read level R4 in the second characteristic data Data2. Since this is only one example, it is also possible that the magnitude between the two characteristic data may differ between the respective default read levels.

The fifth default read level R5 in the first characteristic data Data1 is 1260 mV, and the fifth default read level R5 in the second characteristic data Data2 is 1275 mV. Even if the voltage read from the NAND flash memory measuring the first characteristic data Data1 is 1300 mV and the voltage read from the NAND flash memory measuring the second characteristic data Data2 is also 1300 mV, this may have different meanings depending, for example, on the measurement conditions used to obtain such data.

That is, the voltage in the cell distribution data of the first characteristic data (Data1) may means R5+40 mV, where the voltage in the cell distribution data of the second characteristic data (Data2) may means R5+25 mV. Therefore, a cell count value of 1300 mV for the first cell distribution data (Data1) may have a different meaning than that associated with the second cell distribution data (Data2).

Recognizing such differences, if cell distribution data (e.g., the first to fourth characteristic data, Data1 to Data4) are simply merged, the merged data will almost certainly contain errors or error inducing factors. And as a result, a learning model performing learning in such errant data cannot be assumed to have correct values or correct structure.

Figures 7, 8:
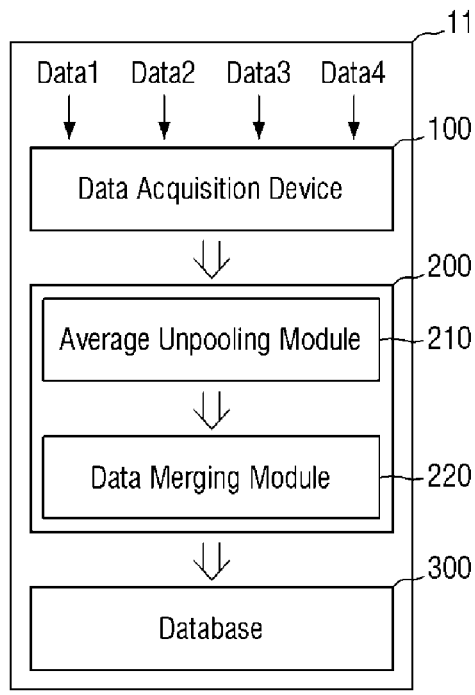
FIG. 7 is a table listing exemplary crop ranges for possible use by a characteristic data pre-processing system according to embodiments of the inventive concept.
FIG. 8 is a block diagram illustrating a characteristic data pre-processing apparatus of the characteristic data pre-processing system according to embodiments of the inventive concept.

Referring now to FIGS. 4, 6, and 7, the data merging module 220 of FIG. 4 may be used to perform data cropping and data merging in certain embodiments of the inventive concept. In this context, the term "data cropping" means a separating or allocation of data. That is, in certain embodiments of the inventive concept, the data merging module 220 may separate the cell distribution data of the first to fourth characteristic data (Data1 to Data4) according to certain defined "crop ranges".

Here, respective crop ranges may be defined (or separated) according to respective default read levels. For example, assuming "M" default read levels, there may be 'm' crop ranges, where each respective crop range is defined according to a corresponding default read level.

Referring to the table of FIG. 7, a first crop range is defined as a value obtained by adding 0 to 1000 mV to a first default read level R1, and a second crop range is defined as a value obtained by adding 0 to 1000 mV to a second default read level R2. A third crop range is defined as a value obtained by adding 0 to 1000 mV to a third default read level R3, and the fourth crop range is defined as a value obtained by adding −1000 to 1000 mV to a sixth default read level R6. A fifth crop range is defined as a value obtained by adding 0 to 2000 mV to a fifth default read level R5, the sixth crop range is defined as a value obtained by adding −1000 to 1000 mV to the sixth default read level R6, and a seventh crop range is defined as a value obtained by adding −1000 to 1000 mV to a seventh default read level R7.

Accordingly, the cell distribution data of the first to fourth characteristic data (Data1 to Data4) may be divided into m sets according to the respective crop ranges. Therefore, resulting training data may include 1st to m-th training data TD1 to TDm (e.g., for a TLC NAND flash memory, (m=7).

In the illustrated examples of FIGS. 4 and 6, the data merging module 220 may be used to merge the cell distribution data separated according to the respective crop ranges. That is, the data merging module 220 may generate the first training data TD1 by merging all of the cell distribution data corresponding to the first crop range, the second training data TD2 by merging all of the cell distribution data corresponding to the second crop range, and so on until m-th training data TDm. Accordingly, 'm' sets of training data may be generated by the data merge module 220 (e.g., one set of training data for a SLC, three sets of training data for a MLC, and seven sets of training data for a TLC).

It should be noted at this point that the definition of training data sets and corresponding default read level(s) may be various determined. For example in the illustrated example of FIG. 7, fourth crop range is not defined by a fourth default read level R4, but rather by the sixth default read level R6. Further, crop ranges need not be uniform in size.

In this manner, the operating characteristics of a particular memory device (e.g., a NAND flash memory) may be taken into account. For example, assuming a TLC NAND flash memory and its corresponding read operation, a separate read operation may be performed for each page of the NAND flash memory. Therefore, least significant bits (LSB) corresponding to the first default read level R1 and the fifth default read level R5 may be read together, and center significant bits (CSB) corresponding to the second default read level R2, the fourth default read level R4 and the sixth default read level R6 may be read together. Further, most significant bits (MSB) corresponding to the third default read level R3 and the seventh default read level R7 may be read together.

Assuming that read operations are performed two times for each page, since the CBS corresponding to the second default read level R2, the fourth default read level R4 and the sixth default read level R6 has three default levels, it is possible to read simultaneously the two default read level regions without separately performing the read operation. Accordingly, the fourth crop range and the sixth crop range corresponding to the fourth default read level R4 and the sixth default read level R6 may be defined based on the sixth default read level R6.

Further, as described above, since different numbers of read levels may be associated with each page, the various crop ranges may be different from each other. That is, each of the first, second, and third crop ranges may be 1000, whereas each of the fourth, fifth, sixth, and seventh crop ranges may be 2000 mV.

Of course, the crop ranges and the reference voltages described herein are all exemplary, and the present inventive concept is not limited thereto. That is, in the characteristic data pre-processing system according to embodiments of the inventive concept, the number and corresponding range of various crop ranges may be set as needed.

Referring back to FIG. 4, the database 300 may be used to store the training data generated by the data pre-processing apparatus 200. That is, 1st to m-th training data TD1 to TDm may be stored in the database 300 for subsequent reference and/or communication to the first data analyzer 20.

The characteristic data pre-processing system according to some embodiments of the inventive concept may perform an appropriate merging of data upon considering different default read levels when merging characteristic data having different default read levels. The training data generated in this manner may be used to build a more meaningful and accurate learning model, because it does not include the errors that would exist is training data were merged without considering the default read levels. With this learning model approach, subsequent control of a NAND flash memory may be made more precise and accurate.

Hereinafter, another characteristic data pre-processing system according to some embodiments of the inventive concept will be described with reference to FIGS. 2 and 8, 9 and 10.

Figure 9:
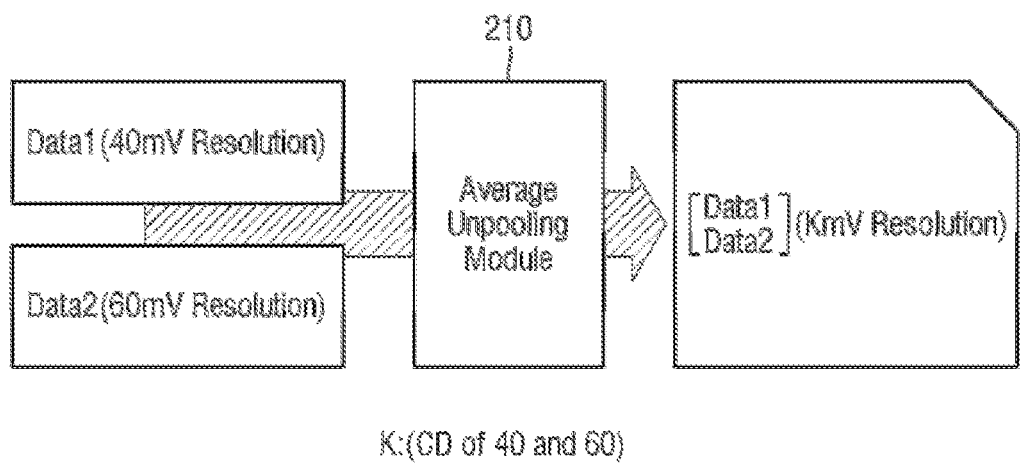
FIG. 9 is a conceptual diagram for explaining the operation of the average unpooling module of FIG. 8.
Figure 10:
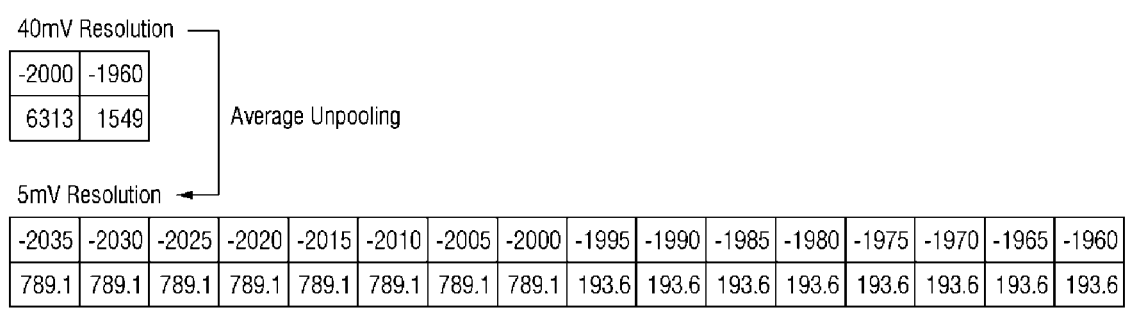
FIG. 10 is a conceptual diagram for explaining a case where cell distribution data is average-unpooled by the average unpooling module of FIG. 8.

FIG. 8 is a block diagram further illustrating another characteristic data pre-processing apparatus 11 in place of characteristic data pre-processing system 10 according to embodiments of the inventive concept. FIG. 9 is a conceptual diagram illustrating in one example the operation of the average unpooling module 210 of FIG. 8, and FIG. 10 is a listing that further describes a case wherein cell distribution data is average-unpooled by the average unpooling module of FIG. 8.

Referring collectively to FIGS. 2 and 8, 9 and 10, the data pre-processing apparatus 200 of the second data pre-processing system 11 of the characteristic data pre-processing system according to embodiments of the inventive concept further includes an average unpooling module 210. The average unpooling module 210 may receive cell distribution data in the first to fourth characteristic data (Data1 to Data4) from the data acquisition device 100. Here, it is assumed for purposes of this description that the cell distribution data shown in FIG. 2 has been derived using different resolutions. As previously noted, such cell distribution data is difficult to accurately merge without further consideration.

The average unpooling module 210 may be used to essentially "match" the differing resolutions of the cell distribution data. Hence, the average unpooling module 210 may communicate resolution-matched cell distribution data to the data merging module 220, and the data merging module 220 may then merge the cell distribution data having the same resolution into appropriate crop ranges.

Referring to FIG. 9, it is assumed that the cell distribution data of the first characteristic data (Data1) has a resolution of 40 mV and the cell distribution data of the second characteristic data (Data2) has a resolution of 60 mV. The average unpooling module 210 may be used to convert both the first characteristic data Data1 and the second characteristic data Data2 into cell distribution data having a common resolution of denoted here as "K" mV.

In the illustrated examples of FIGS. 9 and 10, K may be a common divisor of 40, which is a resolution of the first characteristic data (Data1), and 60, which a resolution of the second characteristic data (Data2). Specifically, referring to FIG. 10 and assuming that K=5, the operation of the average unpooling module 210 will be described.

In the cell distribution data of the first characteristic data (Data1), the cell count value at −2000 mV may be 6313, and the cell count value at −1960 mV may be 1549. Thus, when the resolution is 5 mV, 40 mV include eight 5 mV intervals, one 5 mV resolution from −2035 mV to −2000 mV may have a cell count value of 6313/8≈789.1. Similarly, one 5 mV resolution from −1995 mV to −1960 mV may have a cell count value of 1549/8≈193.6.

The cell count value before average unpooling is an integer, but the cell count value after average unpooling may be double type information. However, this embodiment is not limited thereto.

The characteristic data pre-processing system according to embodiments of the inventive concept allows the resolution formats of the cell distribution data having different resolutions to coincide with each other, so as to enable subsequent cropping and merging to be more easily performed. Therefore, the cell distribution data having different resolutions can also be used to generate training data without difficulty, and the learning model obtained in this way allows the control of the NAND flash memory to be more precise.

Hereinafter, another characteristic data pre-processing system 12 according to embodiments of the inventive concept will be described with reference to FIGS. 11 and 12.

Figure 11:
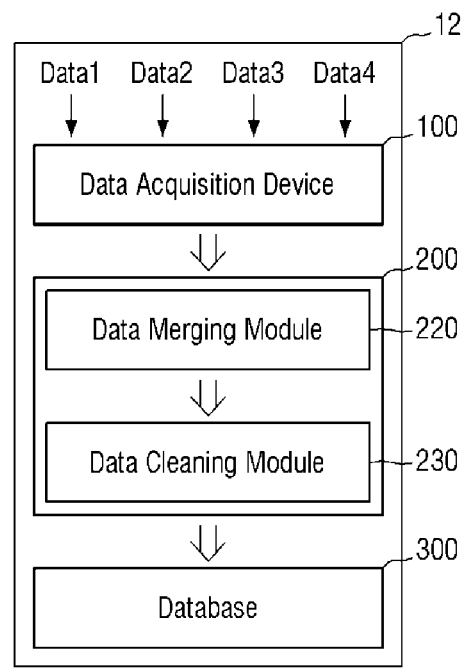
FIG. 11 is a block diagram illustrating another characteristic data pre-processing apparatus of the characteristic data pre-processing system according to embodiments of the inventive concept.
Figure 12:
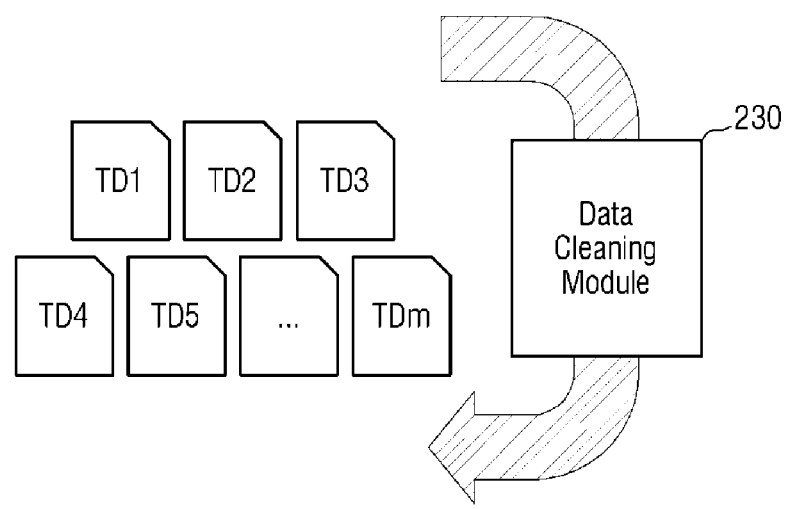
FIG. 12 is a conceptual diagram for explaining the operation of the data cleaning module of FIG. 11.

FIG. 11 is a block diagram illustrating in one example another characteristic data pre-processing apparatus of the characteristic data pre-processing system according to embodiments of the inventive concept, and FIG. 12 is a conceptual diagram further explaining the operation of the data cleaning module of FIG. 11.

Referring to FIGS. 11 and 12, the data pre-processing apparatus 200 of the third data pre-processing system 12 of the characteristic data pre-processing system according to embodiments of the inventive concept further includes a data cleaning module 230.

The data cleaning module 230 may receive the 1st to m-th training data TD1 to TDm from the data merging module 220. The data cleaning module 230 may remove meaningless data (e.g., outdated data and/or invalid data, such as rarely-used initial state information, damaged data, erroneous measurement data and/or corrupted transmission data) from the 1st to m-th training data TD1 to TDm. Here, the "removal of data" by the data cleaning module 30 denotes the removal of meaningless data portions included in the 1st to m-th training data TD1 to TDm, not the removal of any one of the 1st to m-th training data TD1 to TDm.

In this regard, the 1st to m-th training data TD1 to TDm may contain outdated or invalid information about the NAND flash memory. This may particularly be the case when the NAND flash memory has been used for some predetermined period. Therefore, the 1st to m-th training data TD1 to TDm should be meaningful data properly describing the operation of the NAND flash memory even one that has been used for a lengthy period of time (hereafter, "a deteriorated memory device"). If otherwise meaningless data is mixed with 1st to m-th training data TD1 to TDm, the accuracy of the learning model constructed using this meaningless data may be reduced. Thus, the data cleaning module 230 may be used to remove meaningless data.

The data cleaning module 230 may further increase the effectiveness of the 1st to m-th training data TD1 to TDm, as it is communicated from the data cleaning module 230 to the database 300.

The characteristic data pre-processing apparatus according to certain embodiments of the inventive concept can remove the meaningless data in advance to increase the fitness of the training data. Thus, it is possible to more accurately control the NAND flash memory in the future.

Figure 13:
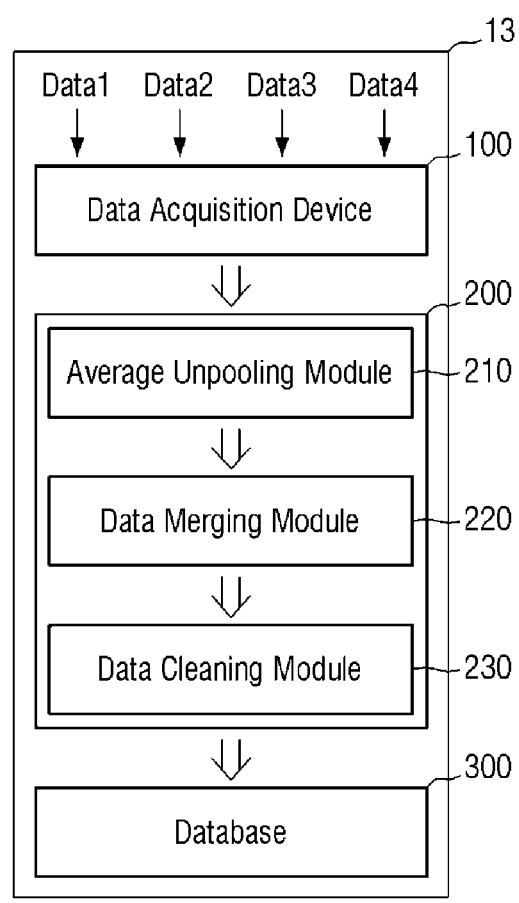
FIG. 13 is a block diagram illustrating still another characteristic data pre-processing apparatus of the characteristic data pre-processing system according to embodiments of the inventive concept.

Hereinafter, a characteristic data pre-processing system according to some embodiments of the present inventive concept will be described with reference to FIG. 13, where FIG. 13 is a block diagram illustrating still another characteristic data pre-processing apparatus of the characteristic data pre-processing system according to embodiments of the inventive concept.

Referring to FIG. 13, the data pre-processing apparatus 200 of the third data pre-processing system 13 of the characteristic data pre-processing system according to some embodiments of the present inventive concept includes an average unpooling module 210, a data merging module 220, and a data cleaning module 230.

First, the average unpooling module 210 may receive cell distribution data in the first to fourth characteristic data (Data1 to Data4) from the data acquisition device 100. The average unpooling module 210 may match the resolutions of cell distribution data having different resolutions. Thus, the cell distribution data in the first to fourth characteristic data may have the same resolution.

Subsequently, the data merging module 220 may divide the cell distribution data of the first to fourth characteristic data into m sets according to the respective crop ranges. At this time, the crop range may be defined based on each default read level.

Further, the data merging module 220 may merge the cell distribution data divided according to each of the crop ranges. That is, the data merging module 220 may generate a plurality of training data, that is, the 1st to m-th training data TD1 to TDm, by merging the cell distribution data for each of the crop ranges.

Subsequently, the data cleaning module 230 may receive the 1st to m-th training data TD1 to TDm from the data merging module 220. The data cleaning module 230 may remove meaningless data from the 1st to m-th training data TD1 through TDm.

The characteristic data pre-processing system according to this embodiment can appropriately merge the cell distribution data having different resolutions from each other, and can appropriately merge the cell distribution data having different default read levels from each other. Further, this characteristic data pre-processing system can generate high-purity training data by removing meaningless data.

Hereinafter, a characteristic data pre-processing system according to some embodiments of the present inventive concept will be described with reference to FIGS. 1, 3, and 14, 15, 16 and 17.

Figure 14:
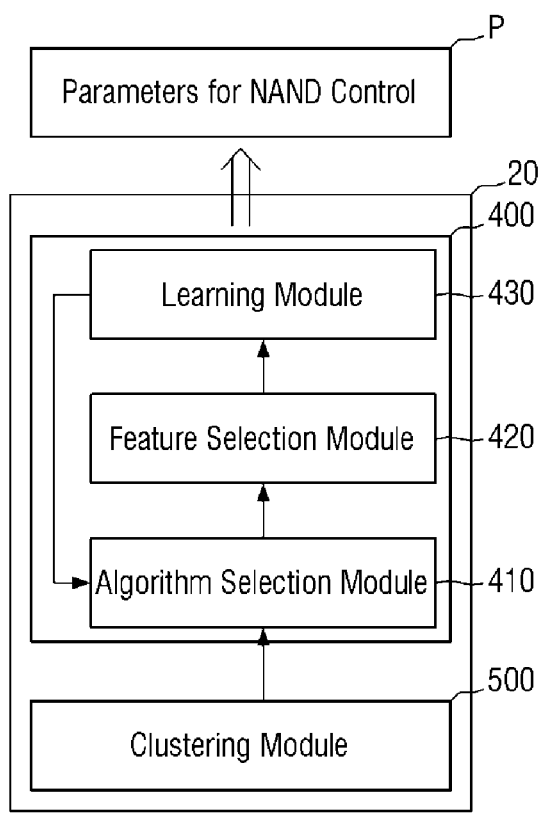
FIG. 14 is a block diagram for explaining a data analyzer of the characteristic data pre-processing system according to some embodiments of the inventive concept.
Figure 15:
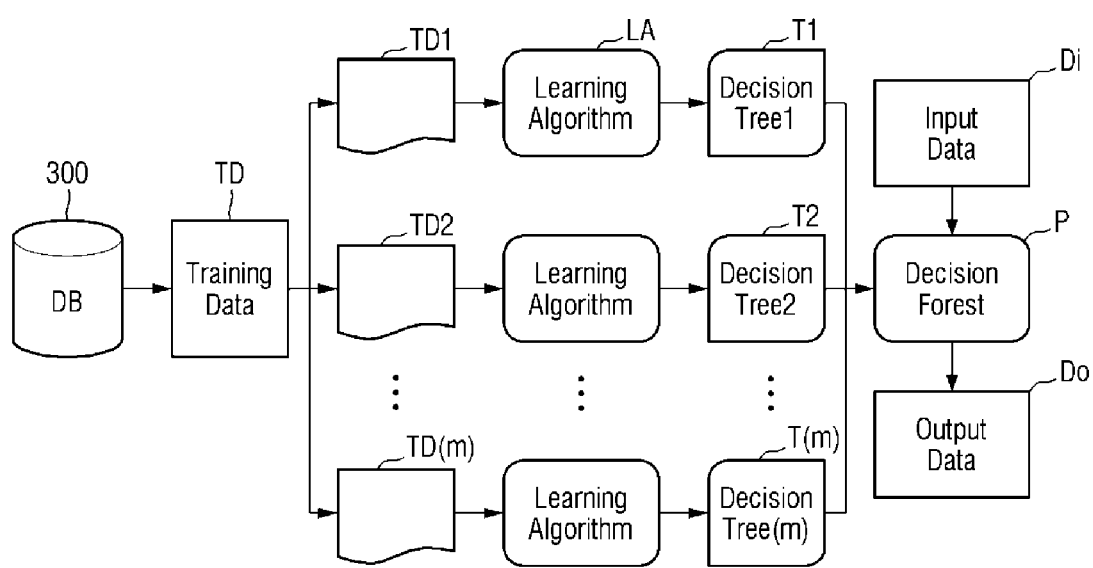
FIG. 15 is a conceptual diagram for explaining the operation of the data analyzer of FIG. 14.
Figure 16:
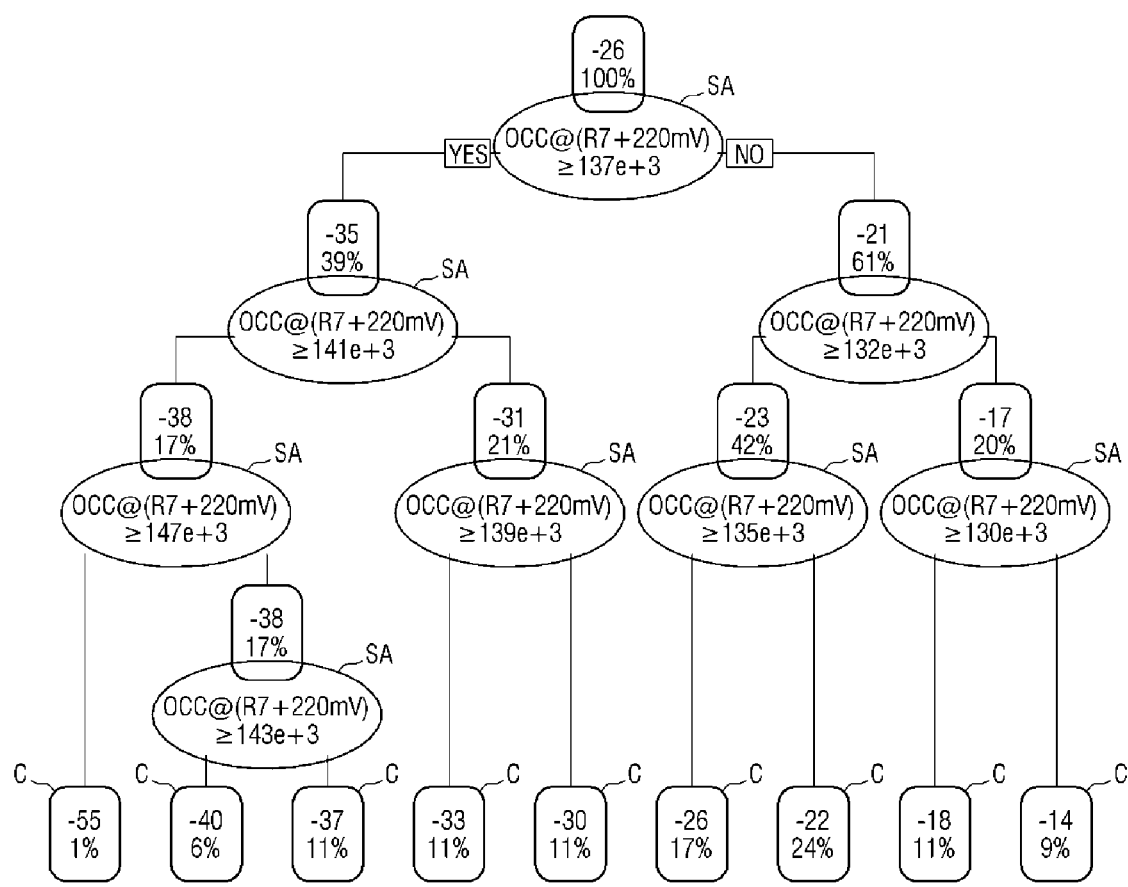
FIG. 16 is an exemplary structure diagram of a seventh decision tree of the data analyzer of FIG. 14.
Figure 17:
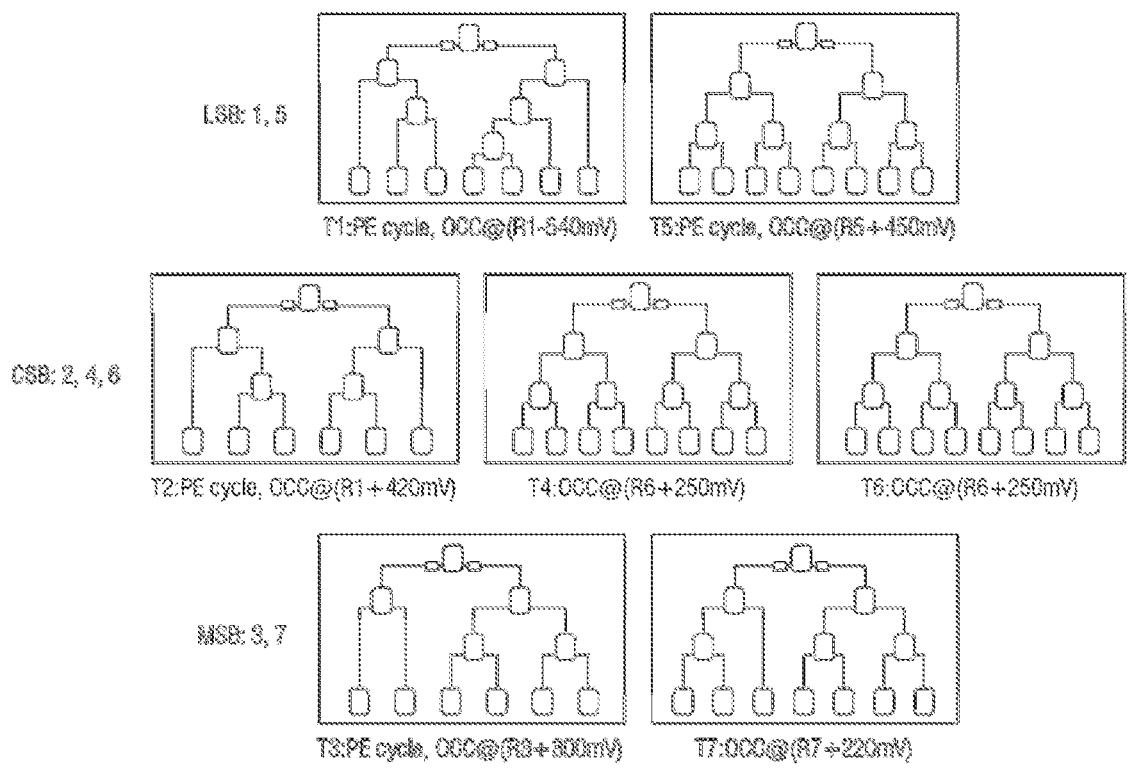
FIG. 17 is an exemplary structure diagram of a decision forest of the data analyzer of FIG. 14.

FIG. 14 is a block diagram further illustrating in one example the data analyzer 20 of a characteristic data pre-processing system according to embodiments of the inventive concept. FIG. 15 is a conceptual diagram for explaining the operation of the data analyzer of FIG. 14. FIG. 16 is an exemplary structure diagram of a seventh decision tree of the data analyzer of FIG. 14, and FIG. 17 is an exemplary structure diagram of a decision forest of the data analyzer of FIG. 14.

Referring to FIGS. 1, 3, and 14, 15, 16 and 17, the first data analyzer 20 of the characteristic data pre-processing system according to embodiments of the inventive concept includes a clustering module 500 and a machine learning module 400. The first data analyzer 20 may receive training data from the first data pre-processing system 10. Of course, the above-described second data pre-processing system 11 or third data pre-processing system 12 may also be provided in place of the first data pre-processing system 10.

The first data analyzer 20 may derive a parameter P for controlling the NAND flash memory. This parameter P may be used as a tool for deriving the optimum read level of the NAND flash memory by using the characteristic data of new NAND flash memory as an input.

The clustering module 500 may receive training data from database 300. The clustering module 500 may cluster each training data and classify the clustered training data into a plurality of classes.

Among the training data, particularly, the cell distribution data is composed of continuous values, so it may be difficult to apply a learning model applied to discrete values. Therefore, the training data is classified into the plurality of classes by the clustering module 500, and each of the classes may be applied to a learning model.

The machine learning module 400 may receive the training data classified into the plurality of classes from the clustering module 500. The machine learning module 400 may derive the above-described parameter P for controlling the NAND flash memory.

The machine learning module 400 includes an algorithm selection module 410, an feature selection module 420, and a learning module 430.

The algorithm selection module 410 may select an algorithm suitable for the training data. For example, the algorithm selection module 410 may select a linear regression-based recursive partitioning algorithm, a multiple linear regression algorithm, or a multiple logistic regression algorithm, when the training data has continuous values.

Further, the algorithm selection module 410 may select a C4.5 algorithm, a decision tree algorithm such as random forest, or a neural network model having a simple structure, when the training data has discrete values as in this embodiment.

The feature selection module 420 may select an attribute for applying the algorithm selected by the algorithm selection module 410. Here, the "attribute" may refer to cell count data at a specific position among PE cycle data, temperature data, wordline number data and cell distribution data in the characteristic data.

The feature selection module 420 may perform an attribute selection through cell count data at a specific position among all independent attributes, that is, P/E cycle data, temperature data, wordline number data and cell distribution data, and a correlation analysis between dependent attributes, that is, optimum read levels.

That is, the feature selection module 420 may select an attribute to be applied by analyzing whether any independent attribute is greatly correlated with the optimum read level.

The learning module 430 may construct a model for predicting the optimum read level using the algorithm selected by the algorithm selection module 410 and the attribute selected by the feature selection module 420. This model may be constructed by machine learning for self-learning the training data.

The prediction model constructed by the learning module 430 may be expressed in a parameter (P) format. That is, the prediction model may be expressed in a format of deriving output data by applying the determined parameter to input data.

When the performance of the prediction module constructed by the learning module 430 is not excellent, the algorithm selection module 410 and the feature selection module 420 may select algorithms and attributes again, respectively. Thus, the learning module 430 may derive a new parameter.

Referring to FIG. 15, the flow of data when the algorithm selection module 410 selects a classification and regression tree (CART) algorithm will be described.

Training data TD is stored in the database 300, and this training data TD may include 1st to m-th training data TD1 to TDm. The 1st to m-th training data TD1 to TDm may be generated by the aforementioned first to fourth data pre-processing systems 10 to 13.

The 1st to m-th training data TD1 to TDm may be learned by learning algorithms LA selected by the algorithm selection module 410, respectively. In this case, all of the 1st to m-th training data TD1 to TDm may be learned by the same kind of learning algorithm LA.

However, attributes selected by the feature selection module 420 may be applied to the 1st to m-th training data TD1 to TDm, respectively. These attributes may be different for each of the 1st to m-th training data TD1 to TDm.

Since the learning algorithms LA are learned completely differently depending on which attribute is used, they can be considered as different learning algorithms LA when attributes are differently selected. Therefore, the 1st to m-th training data TD1 to TDm may be learned by using different learning algorithms LA from each other in this respect (although the same kind of algorithm is used).

The classification and regression tree (CART) algorithm is an algorithm that uses decision trees. Therefore, the first training data TD1 may form a first decision tree T1 through the learning algorithm LA, and the second training data TD2 may form a second decision tree T2 through the learning algorithm LA. Similarly, the m-th training data TDm may form a m-th decision tree.

Referring to FIG. 16, a seventh decision tree can be identified when m=7, that is, a learning model for TLC NAND flash memory.

The seventh decision tree may have eight sub-attributes SA and nine classes C. In this case, the classes C may be decided by the clustering module 500, or may be derived by an algorithm. In this embodiment, the learning model may self-derive the classes C by the CART algorithm.

The attribute selected by the feature selection module 420 in the seventh decision tree may be an ON-cell count value (OCC@(R7+220 mV)) at R7(seventh default read level)+ 220 mV.

The ON-cell count value may not simply mean a cell count value at a specific voltage, but may mean a value obtained by accumulating all the cell count values at a voltage lower than the specific voltage.

The reason for using an ON-cell count value, not a cell count value, is simple. The reason for this is that ON-cell count values, not cell count values, are measured, and these measured ON-cell count values are converted into the cell count values by operation. That is, when the ON-cell count values are used, the operation amount of the system can be further reduced, and thus data analysis can be performed at a higher speed.

The number written on top of each node in the seventh decision tree may be a difference between a default read level and a candidate read level in units of 10 mV. That is, first, when the voltage of the seventh default read level (R7)−260 mV is set as a candidate read level and the ON-cell count value at the seventh default read level (R7)+220 mV is greater than 137e+3, the ON-cell count value moves to a left node, and, at this time, the candidate read level may be set to the seventh default read level (R7)−350 mV.

In this case, when the ON-cell count value at the seventh default read level (R7)+220 mV is greater than 141e+3, the ON-cell count value moves to a left node, and, at this time, the candidate read level may be set to the seventh default read level (R7)−380 mV.

In this case, when the ON-cell count value at the seventh default read level (R7)+220 mV is greater than 147e+3, the ON-cell count value moves to a left node (leaf node, that is, last node), and, at this time, the candidate read level may be set to the seventh default read level (R7)−550 mV.

That is, in this way, the optimum read level can be found through branching. In this case, necessary information is only the ON-cell count value at the seventh default read level (R7)+220 mV. In each node and class (C), the distribution ratio of current node may be displayed. That is, the distribution ratio becomes 100% at the root node, which is the first node, and may decrease as each branch proceeds. The sum of the distribution ratios at the leaf node, which is the lowermost node, may be 100%. It is shown in FIG. 16 that the sum of the distribution ratios at the leaf node exceeds 100% because the distribution ratios are rounded.

Referring to FIG. 17, when m=7, a decision forest P will be described. The decision forest P means that a plurality of decision trees, that is, first to seventh decision trees T1 to T7, are gathered.

Specifically, in the first decision tree T1, the feature selection module 420 selects P/E cycle data and ON-cell count values at the first default read level (R1)−540 mV as attributes. In the second decision tree T2, the feature selection module 420 selects P/E cycle data and ON-cell count values at the first default read level (R1)-420 mV as attributes. In the third decision tree T3, the feature selection module 420 selects PE cycle data and ON-cell count values at the third default read level (R3)−300 mV as attributes.

In the fourth decision tree T4, the feature selection module 420 selects P/E cycle data and ON-cell count values at the sixth default read level (R6)−250 mV as attributes. In the fifth decision tree T5, the feature selection module 420 selects P/E cycle data and ON-cell count values at the fifth default read level (R5)−450 mV as attributes. In the sixth decision tree T6, the feature selection module 420 selects P/E cycle data and ON-cell count values at the sixth default read level (R6)−250 mV as attributes. In the seventh decision tree T7, the feature selection module 420 selects P/E cycle data and ON-cell count values at the seventh default read level (R7)−220 mV as attributes.

As such, the decision forest P may contain different decision trees. Each of the different decision trees, that is, the first to seventh decision trees T1 to T7 may have different sub-attributes SA and different classes. Further, the decision forest P may have decision trees having different kinds of attributes and different structures (that is, the number of steps toward the leaf node, the number of branches, and the like).

As described above, the TLC NAND flash memory may perform a read operation for each page. Thus, least significant bits (LSB) corresponding to the first read level R1 and the fifth default read level R5 may be read together, and center significant bits (CSB) corresponding to the second default read level R2, the fourth default read level R4, and the sixth default read level R6 may be read together. Further, most significant bits (MSB) corresponding to the third default read level R3 and the seventh default read level R7 may be read together.

Assuming that two read operations are performed uniformly for each page, since the CBS corresponding to the second default read level R2, the fourth default read level R4 and the sixth default read level R6 has three default levels, it is possible to read simultaneously the two default read level regions without separately performing the read operation. Accordingly, the fourth decision tree T4 and the sixth decision tree T6 corresponding to the fourth default read level R4 and the sixth default read level R6 may have the same attribute. However, this embodiment is not limited thereto, and the selection of attributes may be performed variously according to the operation of the memory.

Referring to FIG. 15 again, the parameter P formed in this way, that is, the decision forest in this embodiment may derive output data Do through new input data Di. Here, the input data Di may be P/E cycle, ON-cell count values, and the like, and the output data Do may be optimum read level.

The characteristic data pre-processing system according to the present embodiment can pre-process the cell distribution data having different default read levels to generate the training data merged for each crop range. Thus, a separate optimum read level can be derived by selecting an attribute for each training data and applying an algorithm. That is, one prediction model may be constructed in the case of SLC, four prediction models may be independently constructed in the case of MLC, and seven prediction models may be independently constructed in the case of TLC.

Accordingly, the characteristic data pre-processing system and NAND flash memory control system according to some embodiments of the present inventive concept can derive more accurate and precise optimum read level of NAND flash memory.

Hereinafter, a characteristic data pre-processing system according to some embodiments of the present inventive concept will be described with reference to FIGS. 18 and 19. Contents overlapping the above-described contents will be omitted or simplified.

Figures 18, 19:
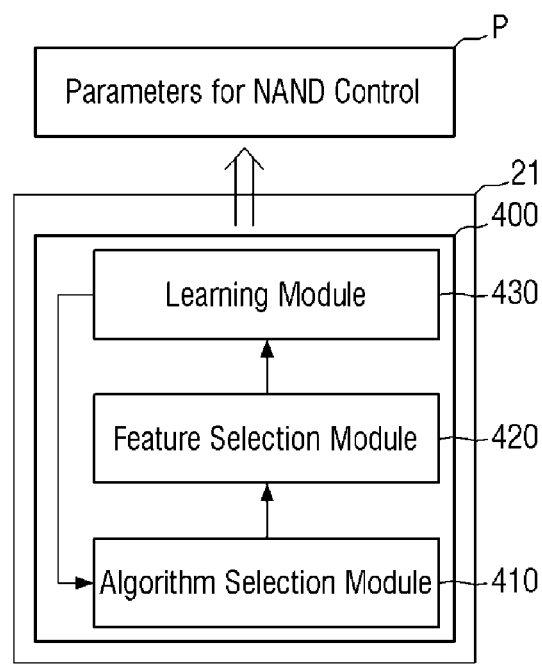
FIG. 18 is a block diagram for explaining another data analyzer of the characteristic data pre-processing system according to some embodiments of the present inventive concept.
FIG. 19 is an exemplary table showing the coefficients of decision polynomial equations determined by the data analyzer of FIG. 18.

FIG. 18 is a block diagram for explaining another data analyzer of a characteristic data pre-processing system according to some embodiments of the present inventive concept, and FIG. 19 is an exemplary table showing the coefficients of decision polynomial equations determined by the data analyzer of FIG. 18.

Referring to FIGS. 18 and 19, the second data analyzer 21 of the characteristic data pre-processing system according to some embodiments of the present inventive concept may include only the machine learning module 400.

The second data analyzer 21 may receive training data from the database 300. Particularly, the cell distribution data of the training data is composed of continuous values. In this case, the training data may be transmitted to the machine learning module 400 without clustering.

The algorithm selection module 410 of the machine learning module 400 may select a linear regression-based recursive partitioning algorithm, a multiple linear regression algorithm, or a multiple logistic regression algorithm.

Decision polynomial equations in the case where the algorithm selection module 410 selects a multiple linear regression algorithm will be described with reference to FIG. 19.

In this embodiment, a decision equation may be used instead of the decision forest P in the embodiment of FIGS. 14 to 17. When the decision equation is a polynomial equation, example of the polynomial equation is represented by $y=A+Bx+Cx^2+Dx^3$. However, this embodiment is not limited thereto. That is, the decision polynomial may be a polynomial having not only 4th order but also other orders.

In some embodiments, the decision equation may be defined a log equation or an exponential equation. That is, the decision equation is not limited thereto as long as it is an equation for predicting an optimum read level.

The characteristic data pre-processing system according to this embodiment may have a much smaller code size when using the decision forest or the like. Since mobile appliances are greatly limited in a code size, it is possible to provide a precise prediction for a learning section while reducing such a size code. Further, since it is a mathematic equation, it can provide a prediction even for sections that have not been learned.

Hereinafter, a characteristic data pre-processing method according to some embodiments of the present inventive concept will be described with reference to FIGS. 2, 5 to 7, 9, 10, and 12.

First, referring to 2, 9 and 10, since the cell distribution data shown in FIG. 2 may have different resolutions, these resolutions can be matched. Illustratively, it is assumed that the cell distribution data of the first characteristic data Data1 has a resolution of 40 mV and the cell distribution data of the second characteristic data has a resolution of 60 mV.

Both the cell distribution data of the first characteristic data (Data1) and the cell distribution data of the second characteristic data (Data2) are converted into cell distribution data having a resolution of K mV. In this case, 'K' may be a common divisor of 40, which is a resolution of the cell distribution data of the first characteristic data (Data1), and 60, which a resolution of the cell distribution data of the second characteristic data (Data2).

Subsequently, referring to FIGS. 5, 6 and 7, data cropping and data merging are performed.

Data cropping may mean separating data. The cell distribution data of the first to fourth characteristic data (Data1 to Data4) may be separated according to the crop range. Subsequently, the cell distribution data separated by the crop range may be merged.

That is, all the cell distribution data corresponding to the first crop range is merged to generate first training data TD1. Similarly, all the cell distribution data corresponding to the second crop range is merged to generate second training data TD2, and n-th training data TDn may also be generated in the same manner.

Subsequently, referring to FIG. 12, meaningless data may be removed from the $1^{st}$ to m-th training data, that is, (e.g.,) invalid data may be removed. The invalid data, for example, may be data on NAND flash memory similar to a rarely-used initial state, or may be data that appears to be incorrect due to damages during measurement or transmission.

The characteristic data pre-processing method according to the present embodiment can appropriately merge the cell distribution data having different resolutions from each other, and can appropriately merge the cell distribution data having different default read levels from each other. Further, this characteristic data pre-processing method can generate high-purity training data by removing meaningless data.

While the present inventive concept has been particularly shown and described with reference to exemplary embodiments thereof, it will be understood by those of ordinary skill in the art that various changes in form and details may be made therein without departing from the scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A characteristic data pre-processing system, comprising:
    a data acquisition device that collects characteristic data including first cell distribution data defined according to first default read levels, and second cell distribution data defined according to second default read levels;
    a data pre-processing apparatus that merges the first cell distribution data and the second cell distribution data according crop ranges to generate training data, wherein the crop ranges are defined according to the first default levels and the second default levels; and
    a database that stores the training data communicated from the data pre-processing apparatus.

2. The characteristic data pre-processing system of claim 1, wherein a number of first default levels, a number of second default levels, a number of first cell distribution data, and a number of second cell distribution data are respectively equal to an integer value of 'm'.

3. The characteristic data pre-processing system of claim 1, wherein the first cell distribution data is defined using a first resolution and the second cell distribution data is defined using a second resolution different from the first resolution, and
    the data pre-processing apparatus further comprises:
    an average unpooling module that equalizes the first resolution of the first cell distribution data and the second resolution of the second cell distribution data.

4. The characteristic data pre-processing system of claim 3,
    wherein the average unpooling module equalizes the first resolution of the first cell distribution data and the second resolution of the second cell distribution data into a third resolution, and
    the third resolution is a common divisor of the first and second resolutions.

5. The characteristic data pre-processing system of claim 4, wherein the average unpooling module uniformly divides a cell count corresponding to the first resolution of the first cell distribution data into a cell count corresponding to the third resolution.

6. The characteristic data pre-processing system of claim 1, wherein the data pre-processing apparatus further comprises a data cleaning module that removes meaningless data from the training data before communicating the training data to the database.

7. The characteristic data pre-processing system of claim 2, where 'm' is equal to $2^N-1$, and 'N' is a number of read data bits of a memory device providing the characteristic data.

8. The characteristic data pre-processing system of claim 7, wherein the memory device is a NAND flash memory device, N=3, and each of the first default read levels and second default read levels respectively includes first to seventh sequentially increasing default read levels.

9. The characteristic data pre-processing system of claim 8, wherein the m crop ranges include first to seventh crop ranges, the first, second and third crop ranges are based on the first, second and third read levels, respectively, the fifth, sixth and seventh crop ranges are based on the fifth, sixth and seventh read levels, respectively, and the fourth, fifth and sixth crop ranges are based on the same read level.

10. The characteristic data pre-processing system of claim 9, wherein the fourth and sixth crop ranges are based on the sixth read level.

11. A characteristic data pre-processing apparatus, comprising:

a data pre-processing system that receives m first cell distribution data derived from a first NAND flash memory using a first resolution and m second cell distribution data derived from a second NAND flash memory using a second resolution different from the first resolution, where 'm' is equal to $2^N-1$ and N is an integer equal to a number of read data bits for each of the first NAND flash memory and the second NAND flash memory, wherein the data pre-processing apparatus comprises:

an average unpooling module that equalizes the first and second resolutions; and a data merging module that merges the first and second cell distribution data according to m crop ranges to generate corresponding training data.

12. The characteristic data pre-processing apparatus of claim 11, wherein the average unpooling module equalizes the first resolution and the second resolution using a third resolution smaller than either one of the first and second resolutions.

13. The characteristic data pre-processing apparatus of claim 11, further comprising:

a data cleaning module that removes meaningless data from the training data.

14. The characteristic data pre-processing apparatus of claim 11, wherein the m crop ranges are defined according to m default read levels for the first and second cell distribution data.

15. The characteristic data pre-processing apparatus of claim 14, wherein the m crop ranges include 1st to m-th crop ranges, and sizes of the k-th crop range are equal to each other between the first and second cell distribution data, where 'k' is an integer.

16. A memory control system, comprising:

a data acquisition device collecting a plurality of characteristic data including first and second cell distribution data;

a data pre-processing apparatus merging the first and second cell distribution data according to predetermined crop ranges to generate training data;

a database including the training data; and a machine learning model learning the training data to derive a control coefficient.

17. The memory control system of claim 16, wherein the machine learning model includes:

an algorithm selection module selecting an appropriate algorithm by analyzing the plurality of characteristic data;

an attribute selection module selecting a core attribute of the characteristic data; and a learning model constructing a prediction model using the algorithm and the core attribute.

18. The memory control system of claim 17, wherein the machine learning model clusters the plurality of characteristic data and classifies the clustered characteristic data into a plurality of classes.

19. The memory control system of claim 17, wherein the attribute selection module selects the core attribute through correlation analysis of attributes of the characteristic data and an optimum read level.

20. The memory control system of claim 19, wherein the prediction model derives an independent control coefficient for each of the crop ranges.

* * * * *